United States Patent [19]
Nguyen et al.

[11] Patent Number: 5,793,114
[45] Date of Patent: Aug. 11, 1998

[54] SELF-ALIGNED METHOD FOR FORMING CONTACT WITH ZERO OFFSET TO GATE

[75] Inventors: Loi N. Nguyen, Carrollton; Robert Louis Hodges, Euless, both of Tex.

[73] Assignee: SGS-Thomson Microelectronics, Inc., Carrollton, Tex.

[21] Appl. No.: 639,316

[22] Filed: Apr. 24, 1996

Related U.S. Application Data

[60] Continuation of Ser. No. 392,061, Feb. 22, 1995, abandoned, which is a division of Ser. No. 169,587, Dec. 17, 1993, Pat. No. 5,439,846.

[51] Int. Cl.[6] .................. H01L 23/485; H01L 23/523; H01L 23/528; H01L 29/41
[52] U.S. Cl. .................. 257/774; 257/773; 257/776; 257/644; 257/647; 257/649; 257/650; 257/758; 257/760
[58] Field of Search .................. 257/644, 647, 257/649, 650, 758, 760, 773, 774, 776

[56] References Cited

U.S. PATENT DOCUMENTS

| | | | |
|---|---|---|---|
| 4,253,907 | 3/1981 | Parry et al. | 156/643 |
| 4,354,896 | 10/1982 | Hunter et al. | 156/643 |
| 4,543,271 | 9/1985 | Peters | 427/54.1 |

(List continued on next page.)

FOREIGN PATENT DOCUMENTS

| | | | |
|---|---|---|---|
| 0111706 | 6/1984 | European Pat. Off. | |
| 265638 | 5/1988 | European Pat. Off. | |
| 0 327 412 | 8/1989 | European Pat. Off. | |
| 491408 | 6/1992 | European Pat. Off. | |
| 0523856 | 1/1993 | European Pat. Off. | |
| 0534130 | 3/1993 | European Pat. Off. | |
| 0 185 787 | 7/1986 | Germany. | |
| 4102422 | 8/1991 | Germany. | |
| 54-107270 | 8/1979 | Japan | 257/644 |
| 56-164578 | 12/1981 | Japan | 257/774 |
| 59-159544 | 9/1984 | Japan | 257/644 |
| 60-58635 | 4/1985 | Japan. | |
| 60-246675 | 12/1985 | Japan. | |
| 61-26240 | 2/1986 | Japan. | |
| 61-232646 | 10/1986 | Japan. | |
| 63-293946 | 11/1988 | Japan. | |
| 64-82653 | 3/1989 | Japan | 257/760 |
| 2-192724 | 7/1990 | Japan | 257/773 |
| 3-133131 | 6/1991 | Japan. | |
| 4092453 | 3/1992 | Japan. | |
| 4-196486 | 7/1992 | Japan. | |
| 5-74958 | 3/1993 | Japan. | |
| 5-267477 | 10/1993 | Japan | 257/760 |
| 2 083 948 | 3/1982 | United Kingdom. | |
| 2 106 315 | 4/1983 | United Kingdom. | |
| 89/01236 | of 0000 | WIPO. | |

OTHER PUBLICATIONS

J. Electrochem. Soc., vol. 139, No. 2, Feb. 1992, "Polysilicon Planarization Using Spin–On Glass", S. Ramaswami & A. Nagy, pp. 591–599.

J. Electrochem. Soc., vol. 139, No. 2, Feb. 1992, "Three 'Low Dt'Options for Planarizing the remetal Dielectric on an Advanced Double Poly BiCMOS Process", by W. Dauksher, M. Miller, and C. Tracy, pp. 532–536.

J. Electrochem. Soc., vol. 140, No. 4, Apr. 1993, "The Effect of Plasma Cure Temperature on Spin–On Glass", by H. Namatsu and K. Minegishi, pp. 1121–1125.

IEEE Electron Device Letters, vol. 12, No. 3, Mar. 1991, "Hot–Carrier Aging of the MOS Transistor in the Presence of Spin–On Glass as the Interlevel Dielectric", N. Lifshitz and G. Smolinsky, pp. 140–142.

(List continued on next page.)

*Primary Examiner*—Carl W. Whitehead
*Assistant Examiner*—Alice W. Tang
*Attorney, Agent, or Firm*—Richard A. Bachand; Theodore E. Galanthay; Lisa K. Jorgenson

[57] ABSTRACT

A method and structure for self-aligned zero-margin contacts to active and poly-1, using silicon nitride (or another dielectric material with low reflectivity and etch selectivity to oxide) for an etch stop layer and also for sidewall spacers on the gate.

32 Claims, 4 Drawing Sheets

U.S. PATENT DOCUMENTS

| | | | |
|---|---|---|---|
| 4,654,112 | 3/1987 | Douglas et al. | 156/643 |
| 4,656,732 | 4/1987 | Teng et al. | 29/591 |
| 4,657,628 | 4/1987 | Holloway et al. | 156/643 |
| 4,686,000 | 8/1987 | Heath | 156/643 |
| 4,707,218 | 11/1987 | Giammarco et al. | 156/643 |
| 4,715,109 | 12/1987 | Bridges | 257/754 |
| 4,721,548 | 1/1988 | Morimoto | 156/657 |
| 4,755,476 | 7/1988 | Bohm et al. | |
| 4,792,534 | 12/1988 | Tsuji et al. | 437/229 |
| 4,801,350 | 1/1989 | Mattox et al. | 156/643 |
| 4,801,560 | 1/1989 | Wood et al. | 437/195 |
| 4,810,666 | 3/1989 | Taji | 437/30 |
| 4,818,335 | 4/1989 | Karnett | 257/637 |
| 4,824,767 | 4/1989 | Chambers et al. | 430/313 |
| 4,894,351 | 1/1990 | Batty | 437/190 |
| 4,912,061 | 3/1990 | Nasr | 437/44 |
| 4,962,414 | 10/1990 | Liou et al. | 257/773 |
| 4,986,878 | 1/1991 | Malazgirt et al. | 156/643 |
| 4,988,423 | 1/1991 | Yamamoto et al. | 204/192.17 |
| 5,003,062 | 3/1991 | Yen | 437/231 |
| 5,061,646 | 10/1991 | Sivan et al. | 437/31 |
| 5,063,176 | 11/1991 | Lee et al. | 437/195 |
| 5,110,763 | 5/1992 | Matsumoto | 437/195 |
| 5,117,273 | 5/1992 | Stark et al. | 257/773 |
| 5,158,910 | 10/1992 | Cooper et al. | 437/195 |
| 5,166,088 | 11/1992 | Ueda et al. | 437/47 |
| 5,174,858 | 12/1992 | Yamamoto et al. | 257/758 |
| 5,200,808 | 4/1993 | Koyama et al. | 257/760 |
| 5,214,305 | 5/1993 | Huang et al. | 257/755 |
| 5,244,841 | 9/1993 | Marks et al. | 437/228 |
| 5,250,472 | 10/1993 | Chen et al. | 437/231 |
| 5,254,867 | 10/1993 | Fukuda et al. | 257/346 |
| 5,256,895 | 10/1993 | Bryant et al. | 257/760 |
| 5,260,229 | 11/1993 | Hodges et al. | 437/69 |
| 5,266,516 | 11/1993 | Ho | 437/57 |
| 5,266,525 | 11/1993 | Morozumi | 437/195 |
| 5,310,720 | 5/1994 | Shin et al. | 437/231 |
| 5,320,983 | 6/1994 | Ouellet | 437/231 |
| 5,323,047 | 6/1994 | Nguyen | 257/774 |
| 5,380,553 | 1/1995 | Loboda | 427/226 |
| 5,411,917 | 5/1995 | Forouhi et al. | 437/195 |

OTHER PUBLICATIONS

Journal of the Electrochemical Society, vol. 138, No. 10, Oct. 1991, Manchester, New Hampshire US, pp. 3019–3024, K. Fujino et al., "Doped silicon oxide deposition by atmospheric pressure and low temperature chemical vapor deposition using tetraethoxysilane and ozone".

Wolf, S. et al. "Silicon Processing for the VLSI Era, vol. 1, Process Technology", 1986, Lattice Press, pp. 182–185.

Wolf, S. et al. Silicon Processing for the VLSI Era, vol. 2, Process Integration, 1990, Lattice Press, pp. 273–275.

L.M. Ephrath and G.S. Mathad, "Etching–Applications and Trends of Dry Etching," in Handbook Of Advanced Technology And Computer Systems(ed. G. Rabbat 1988), pp. 27–35, 38–72.

B. Gorowitz and R. Saia, "Reactive Ion Etching," in VLSI Electronics, vol. 8 (ed. N. Einspruch and D. Brown 1984), pp. 298–316, 318–339.

Device Physics (Handbook Of Semiconductors, vol. 4) pp. 208–209 (ed. C. Hilsum 1981).

A. Schiltz, "Advantages of Using Spin on Glass Layer in Interconnection Dielectric Planarization" Microelectronic Engineering, vol. 5, pp. 413–421 (1986).

S. Ghandhi, VLSI Fabrication Principles, pp. 499–501, 479–482.

"Plasma Etch Anisotropy–Theory and Some Verifying Experiments Relating Ion Transport, Ion Energy and Etch Profiler", J. Electrochem. Soc:Solid–State Science & Technology, C. B. Zarowin, May 1983, pp. 1144–1152.

IBM Technical Disclosure Bulletin, vol. 30, No. 8, Jan. 1988, "Methods of Forming Small Contact Holes".

IBM Technical Disclosure Bulletin, vol. 29, No. 3, Aug. 1986, "Method to Produce Sizes in Openings in Photo Images Smaller Than Lithographic Minimum Size".

IEDM 1987 (Dec. 1987), pp. 358–361, Lau et al. "A Super Self–Aligned Source/Drain MOSFET".

IEDM 1992 (Apr. 1992) pp. 837–840, Fukase et al., "A Margin–Free Contact Process Using $Al_2O_3$ Etch–Stop Layer for High Density Devices".

Semiconductor Int'l, Aug. 1993, p. 36, Pete Singer, "A New Technology for Oxide Contact and Via Etch".

Subbanna, S., et al.; "A Novel Borderless Contact/Interconnect Technology Using Aluminum Oxide Etch Stop for High Performance SRAM and Logic"; Institute Of Electrical And Electronics Engineers, pp. 441–444, Dec. 5, 1993, Proceedings of the International Electron Devices Meeting, New York.

IBM Technical Disclosure Bulletin, vol. 32, No. 4A, Sep. 1989, pp. 344–345, Sep. 1989.

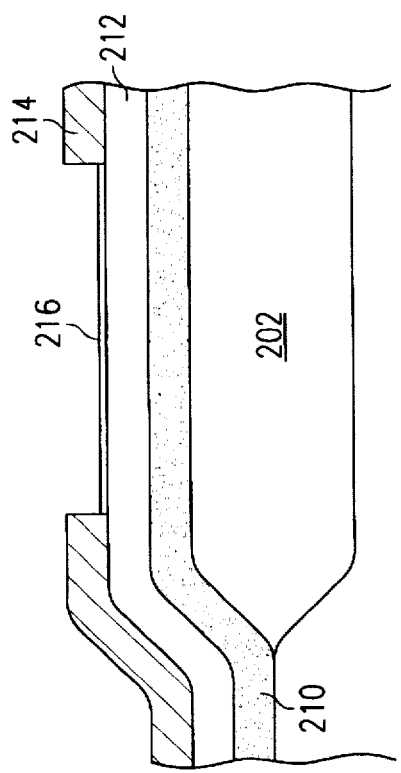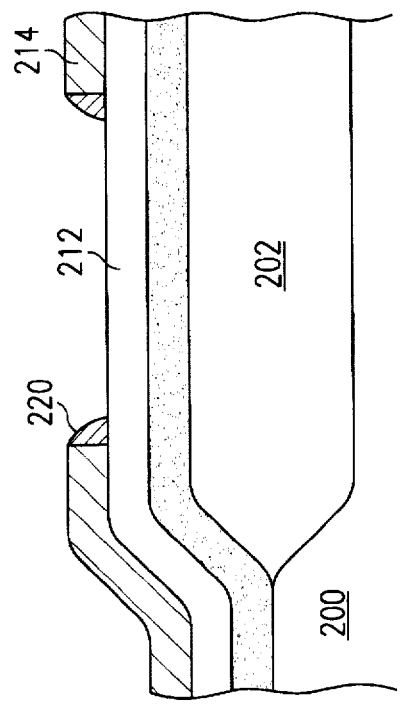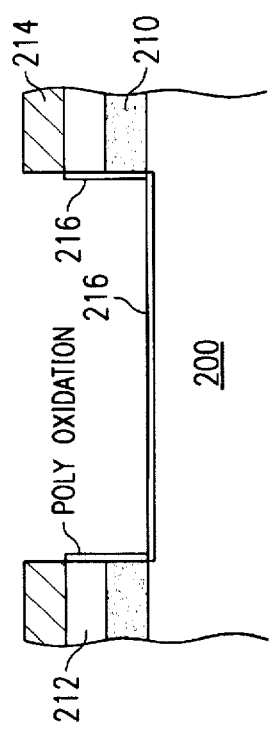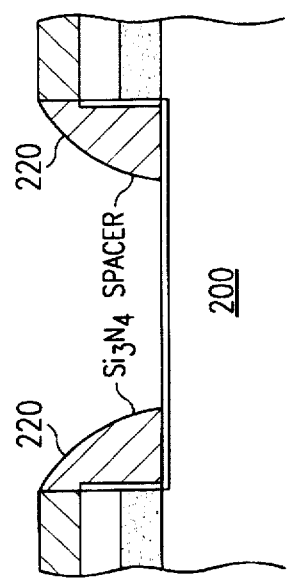
FIG. 4A
FIG. 4B
FIG. 5A
FIG. 5B

SELF-ALIGNED METHOD FOR FORMING CONTACT WITH ZERO OFFSET TO GATE

This application is a continuation of application Ser. No. 08/392,061 filed Feb. 22, 1995 and now abandoned which is a division of application Ser. No. 08/169,587 filed Dec. 17, 1993 and now U.S. Pat. No. 5,439,846.

BACKGROUND AND SUMMARY OF THE INVENTION

The present invention relates to integrated circuit fabrication methods and structures, and particularly to integrated circuits with minimum linewidths below one-half micron.

The disclosed innovations are particularly useful for the sub-half-micron regime, and are thus particularly relevant to product generations such as 16M SRAMs and 64M DRAMs.

Practically all technologies to date use a sidewall $SiO_2$ spacer on the polycide gate for lightly doped drain formation. However, this leads to some problems, since the deposition of oxides in narrow spaces is normally not perfectly conformal, and since loading effects during the spacer etch may cause slower etching of large areas of oxide. Significant overetch of the field oxide regions therefore occurs during the etch step which forms the sidewall oxides. This erosion of the field oxide may be sufficient to permit the implant which forms the heavily doped source/drain regions to partially penetrate the field oxide (and therefore undesirably lower the threshold voltage of the parasitic thick-field transistors, and therefore degrade the effectiveness of isolation). Also, because the spacer is made of oxide, a design rule for minimum contact-to-gate spacing must be maintained so that the contact does not short to the gate due to alignment tolerances. This minimum contact-to-gate spacing imposes constraints on layout, and can waste area. Therefore, it would be desirable to remove the need for this design rule.

In order to address this issue, as well as reflective notching of the polycide gate during patterning,[1] a thick oxide has been deposited on top of the polycide prior to pattern and etch. Although this buys more margin, it still does not resolve the problem.

[1] Where the material underlying a photoresist layer is reflective and nonplanar, light may be reflected laterally from a more-illuminated location to a less-illuminated location, degrading the accuracy of patterning.

Another method uses a second poly as the "landing pads" for bitline contacts in the matrix. In this way, the wordlines are protected thereby allowing for zero contact-to-gate spacing. The drawback is that this method cannot be used in the periphery due to contact resistance problems which result in slower operation of the device.

Another method uses a silicon nitride deposition on top of the polycide prior to pattern and etch. (See Singer, "A New Technology for Oxide Contact and Via Etch", SEMICONDUCTOR INTERNATIONAL, August 1993, p.36, which is hereby incorporated by reference.) Through the use of highly selective nitride to oxide etch selectivities, this will reduce the possibility of the contact touching the top of the polycide; however, it can still make contact along the sidewall due to the removal of the oxide spacer. Additionally, this does not address the problem of overetching the field oxide during the spacer etch.

Still another proposed method uses an $Al_2O_3$ etch-stop layer to achieve a zero-margin contact process. (See Fukase et al., "A Margin-Free Contact Process Using an $Al_2O_3$ Etch-Stop Layer for High-Density Devices," 1992 IEDM PROCEEDINGS 33.3, which is hereby incorporated by reference.)

The disclosed inventions describe new methods of forming self-aligned contact utilizing $Si_3N_4$ (or other dielectric film with lower reflectivity than $WSi_x$ film and good etch selectivity to oxide film; e.g. oxynitride, metallic oxides, etc.). The $Si_3N_4$ film can be used as follows:

1. serve as the anti-reflecting coating ("ARC") for gate patterning
2. gate spacer for LDD (lightly doped drain)
3. contact etch stop layer.

The disclosed innovative techniques are used to simultaneously form contacts to multiple levels of poly/polycide, as well as to active areas (both for multiple poly interconnecting and metal interconnects), with zero contact-to-poly spacing. This is a significant advantage. Furthermore, this technique can be applied both in the memory array and in the circuit periphery without any degradation in circuit performance.

To avoid problems due to nitride sidewall spacers a polysilicon reoxidation step is performed, after the gate etch, to ensure that a pad oxide is present under the nitride spacers which are then formed on the sidewalls of the gate. This helps to avoid accumulated charge due to trapping of hot carriers.

According to a disclosed class of innovative embodiments, there is provided: An integrated circuit fabrication method, comprising the steps of: providing a substrate which includes exposed surface portions of substantially monolithic semiconductor material separated by regions of field dielectric; forming a gate dielectric on said surface portions; forming a first thin-film conductor layer over said gate dielectric and said field dielectric; forming a first thin-film dielectric layer over said first conductor layer; selectively removing said first dielectric layer from locations where contact to said first conductor layer will be formed over said field dielectric; anisotropically etching said first conductor layer, together with said first dielectric layer thereover, to leave said conductor layer in a pattern which provides transistor gates in desired locations, and also exposes locations where contact will be formed to said surface portions of said semiconductor material; performing oxidation, to grow an oxide layer on exposed portions of said conductor layer and said surface portions; depositing a second layer of dielectric material overall, and anisotropically etching said second layer to leave sidewall spacers adjacent to edges of said conductor layer; depositing an interlevel dielectric overall, said interlevel dielectric having a composition which is significantly different from that of said first and second dielectric layers, and etching to expose contact locations, using an etch chemistry which etches said interlevel dielectric selectively with respect to said first and second dielectrics; and depositing a second thin-film conductor layer to make contact to exposed portions of said first conductor layer and said semiconductor material.

According to another disclosed class of innovative embodiments, there is provided: An integrated circuit fabrication method, comprising the steps of: providing a substrate which includes exposed surface portions of substantially monolithic semiconductor material separated by regions of field dielectric; forming a gate dielectric on said surface portions; forming a first thin-film conductor layer over said gate dielectric and said field dielectric; forming a first thin-film dielectric layer over said first conductor layer; selectively removing said first dielectric layer from locations where contact to said first conductor layer will be formed over said field dielectric; anisotropically etching said first conductor layer, together with said first dielectric layer thereover, to leave said conductor layer in a pattern which provides transistor gates in desired locations, and also exposes locations where contact will be formed to said surface portions of said semiconductor material; performing oxidation, to grow an oxide layer on exposed portions of said conductor layer and said surface portions; depositing a second layer of dielectric material overall, and anisotropically etching said second layer to leave sidewall spacers adjacent to edges of said conductor layer; depositing overall an interlevel dielectric predominantly comprising silicon oxides, and etching to expose contact locations, using an etch chemistry which etches said interlevel dielectric selectively with respect to said first and second dielectrics; and depositing a second thin-film conductor layer to make contact to exposed portions of said first conductor layer and said semiconductor material, and patterning said second conductor layer to implement a desired pattern of electrical interconnection.

According to another disclosed class of innovative embodiments, there is provided: An integrated circuit fabrication method, comprising the steps of: providing a substrate which includes exposed surface portions of substantially monolithic semiconductor material separated by regions of field dielectric; forming a gate dielectric on said surface portions; forming a first thin-film conductor layer over said gate dielectric and said field dielectric; forming a first thin-film dielectric layer over said first conductor layer; selectively removing said first dielectric layer from locations where contact to said first conductor layer will be formed over said field dielectric; anisotropically etching said first conductor layer, together with said first dielectric layer thereover, to leave said conductor layer in a pattern which provides transistor gates in desired locations, and also exposes locations where contact will be formed to said surface portions of said semiconductor material; performing oxidation, to grow an oxide layer on exposed portions of said conductor layer and said surface portions; depositing a second layer of dielectric material overall, and anisotropically etching said second layer to leave sidewall spacers adjacent to edges of said conductor layer; depositing overall an interlevel dielectric predominantly comprising silicon oxides, and etching to expose contact locations, using an etch chemistry which etches said interlevel dielectric selectively with respect to said first and second dielectrics; and depositing a second thin-film conductor layer to make contact to exposed portions of said first conductor layer and said semiconductor material, and patterning said second conductor layer to implement a desired pattern of electrical interconnection.

According to another disclosed class of innovative embodiments, there is provided: An integrated circuit, comprising: a body of monocrystalline semiconductor material, having active areas therein separated by field dielectric regions of a first dielectric material; a first patterned thin-film conductor layer, capacitively coupled to said semiconductor material in multiple transistor channel locations in said active areas, and also running across portions of said field dielectric regions; an interlevel dielectric material overlying said first thin-film conductor layer, and having contact holes therein; a second patterned thin-film conductor layer overlying said interlevel dielectric material, and extending down through said contact holes to make contact to said first conductor layer in selected locations, and also to said active areas in selected locations; wherein a layer of a second dielectric material, which is different from said first dielectric material and from said interlevel dielectric material, overlies said first thin-film conductor, beneath said interlevel dielectric; and wherein sidewall spacers of said second dielectric material abut sidewalls of said first conductor layer at said selected locations.

BRIEF DESCRIPTION OF THE DRAWING

The present invention will be described with reference to the accompanying drawings, which show important sample embodiments of the invention and which are incorporated in the specification hereof by reference, wherein:

FIGS. 2A–7A show sequential process steps along section A—A of FIG. 1, and corresponding FIGS. 2B–7B show the same sequence of process steps along section B—B of FIG. 1.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
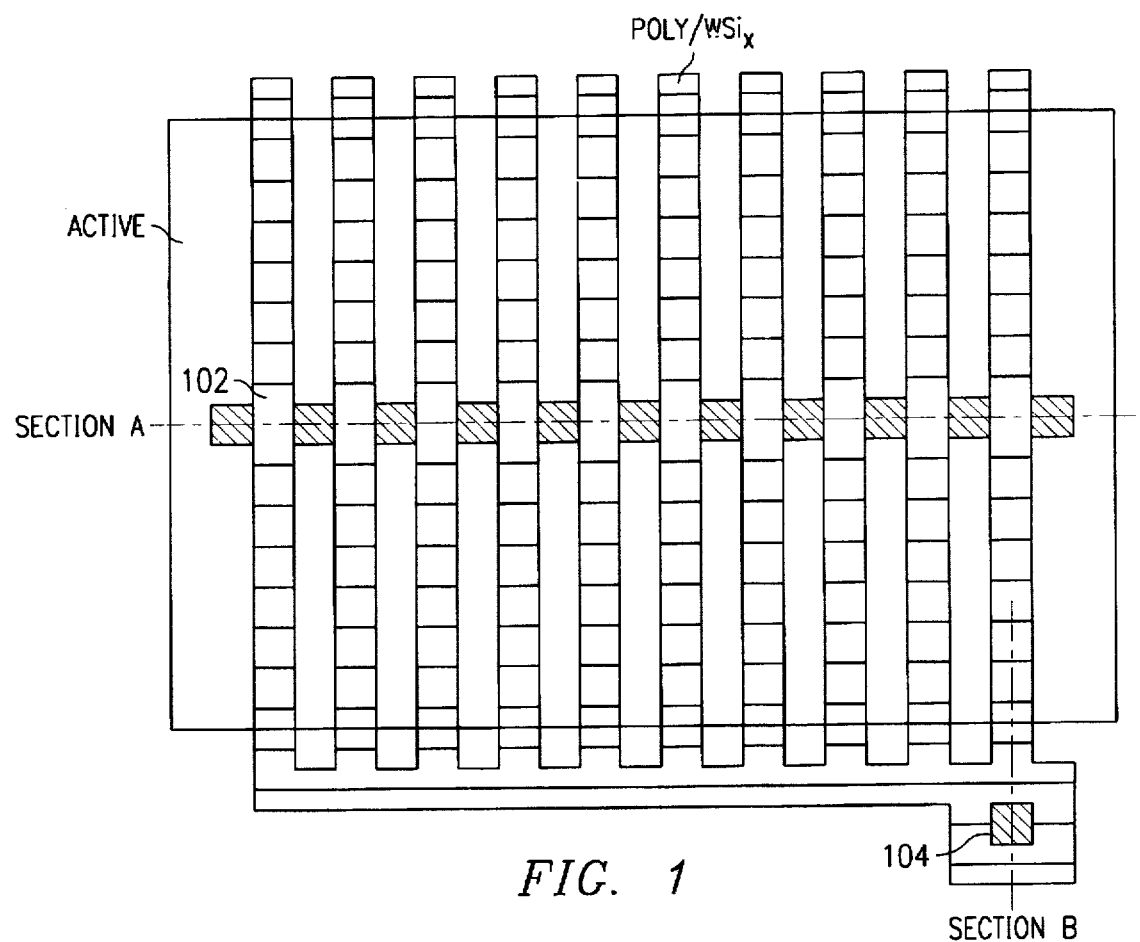
FIG. 1 shows a simple example of an integrated circuit structure.

FIG. 1 shows a simple example of an integrated circuit structure. (As will be recognized by those skilled in the art, this is a simplified example of a device structure, which includes features in common with many high-density structures, including not only memory cells, large output transistors, etc.) In this structure, a number of transistor locations 102 (i.e. locations where poly crosses over Active) occur along Section line A—A, and a first-poly-contact location 104 where contact is made to poly over field oxide occurs along section line B—B. (Note that these first-poly-contact locations are NOT related to the "first contacts" or direct contacts which were sometimes used, in the 1970s and 1980s, to form contacts directly from first poly to active.)

Figure 2B:
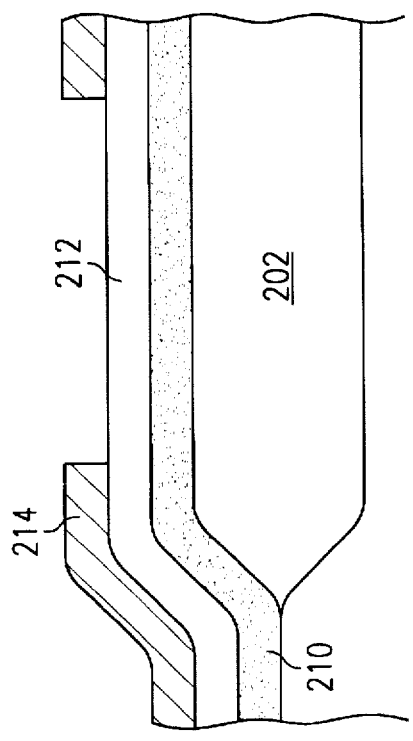
Figure 3B:
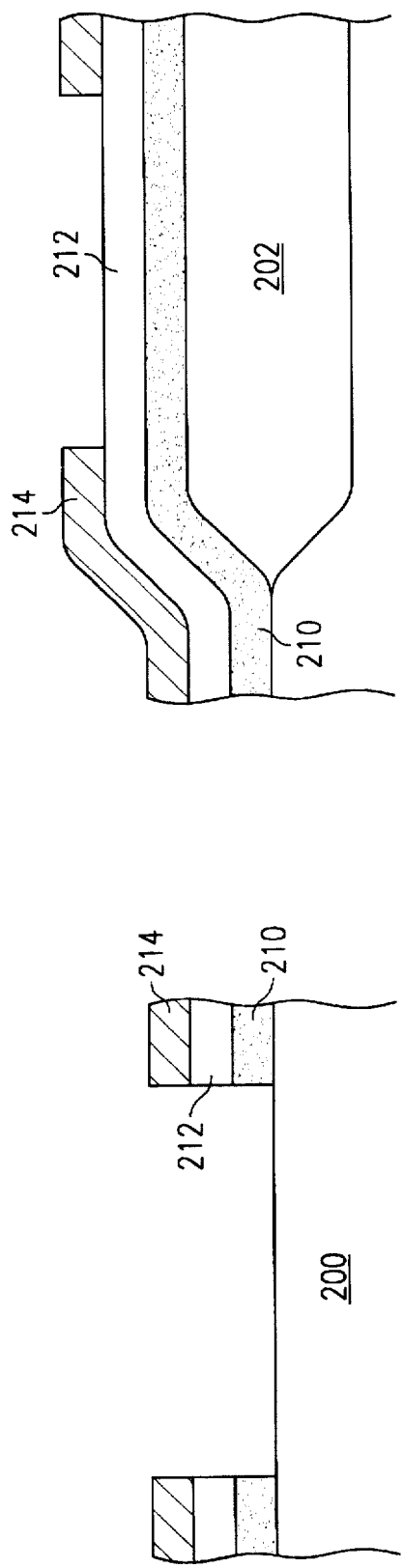
Figure 2A:
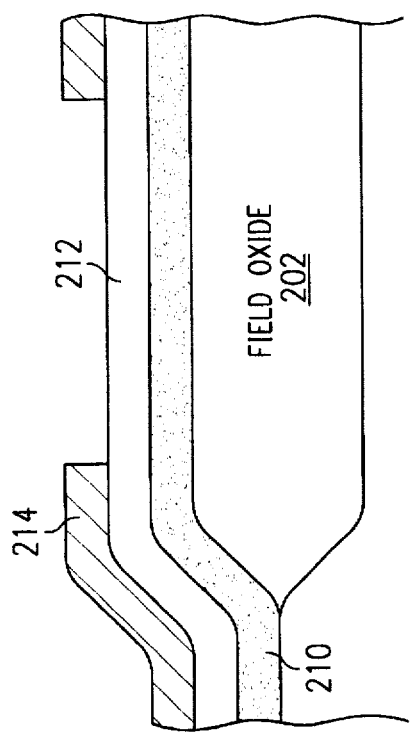
Figure 3A:
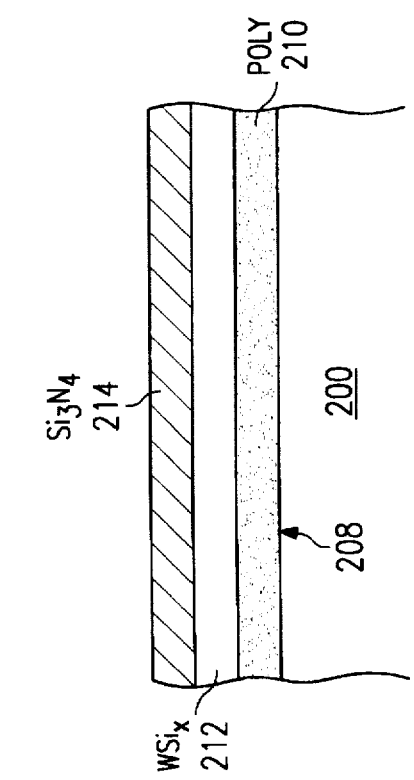

FIGS. 2A, 3A, 4A, etc., show sequential process steps at transistor gate sidewall locations 102 (along section A—A), and corresponding FIGS. 2B, 3B, 4B, etc., show the same sequence of process steps at first-poly-contact location 104 (along section B—B).

In FIG. 2B, note that an additional mask (the "FPC" mask) is used to remove the nitride etch stop in locations where a contact to poly will be required.

After conventional beginnings (preparation of silicon wafer 200, formation of N-wells and P-wells, formation of field oxide 202 to e.g. 5000 Å, sacrificial oxide grown and stripped, gate oxide grown to e.g. 150 Å, threshold voltage adjustment, etc. etc.), fabrication proceeds as follows:

1. Polysilicon 210 is deposited, e.g. to a thickness of 1700 Å, and doped.
2. Tungsten silicide ($WSi_x$) 212 is deposited by chemical vapor deposition (CVD) to a thickness of e.g. 2100 Å.
3. $Si_3N_4$ layer 214 (or another suitable material, e.g. oxynitride, as discussed below) is deposited.
4. The First-poly-contact pattern (the "FPC" mask) is used to etch an opening through the nitride layer 214 in locations where contacts to the clad first-poly layer 210/212 will be formed over field oxide 202.

This results in the structure shown in FIGS. 2A and 2B.

4. The poly-1 mask is now used to pattern the gate polycide layer.

This results in the structure shown in FIGS. 3A and 3B

5. A re-oxidation step (e.g. 5–30 minutes at a temperature of 800°–900° C. in an atmosphere of $H_2O/N_2$ or $O_2/N_2$, in the presently preferred embodiment) is then performed to proved substrate protection. This grows an additional thickness of oxide 216 on the exposed portions of the active area, as well as on exposed portions of the polysilicon 210 and silicide 212.

This results in the structure shown in FIGS. 4A and 4B.

6. A conventional LDD implant is then performed. Deep anti-punch-through implants may also be performed at this stage if desired.

7. $Si_3N_4$ is then deposited conformally (e.g. to a thickness of 1500 Å in the presently preferred embodiment) and etched anisotropically, using an $SF_6+CF_4$ etch chemistry with endpoint detection, to produce sidewall spacers 220. Note that the height of the sidewall spacers 220 on the poly-1 sidewalls is greater than that of the gate polycide structure. Note that smaller spacers 220 also appear on the sidewalls of the FPC aperture, in addition to those on the poly-1 sidewalls.

This results in the structure shown in FIGS. 5A and 5B.

8. Other multi-poly processing steps may now be performed as desired. For example, n+ and p+ source/drain implants may now be performed, and active cladding or local interconnects may be formed if desired.

9. An interlevel dielectric—e.g. BPSG 232 over undoped silica glass 230, in the presently preferred embodiment—is now deposited, and is etched using an oxide etch chemistry which is selective to $Si_3N_4$. In the presently preferred embodiment, this performed using a fluoro-etch with sacrificial silicon in the chamber. See Singer, "A New Technology for Oxide Contact and Via Etch", SEMICONDUCTOR INTERNATIONAL, August 1993, p.36, which is hereby incorporated by reference.

Figure 6A:
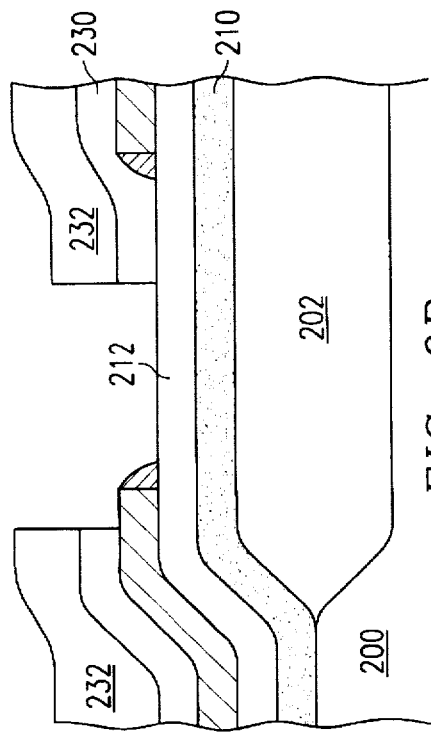
Figure 6B:
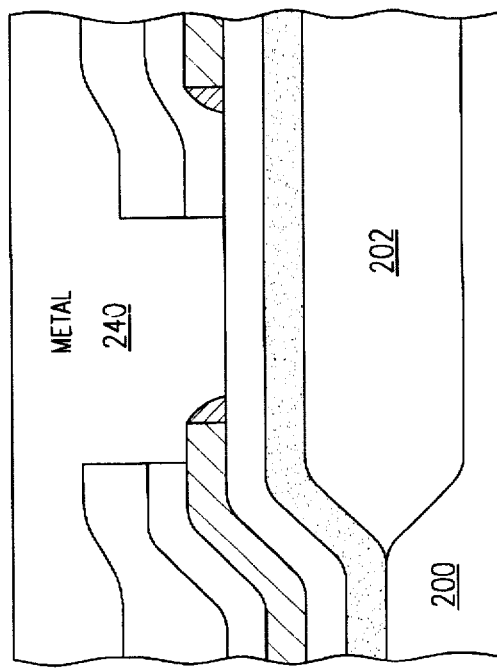

This results in the structure shown in FIGS. 6A and 6B.

10. Metal 240 is now deposited, patterned, and etched to form a desired interconnect pattern. A wide variety of conventional metallization structures may be used, e.g. Al:1% Si:1% Cu, or a Ti/W/Al stack, or other known thin film recipes.

Figure 7A:
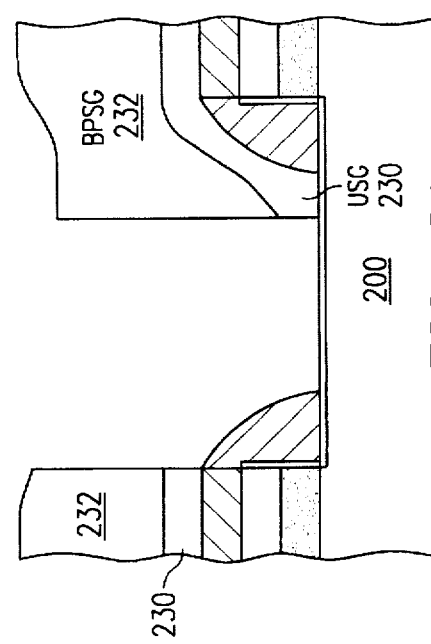
Figure 7B:
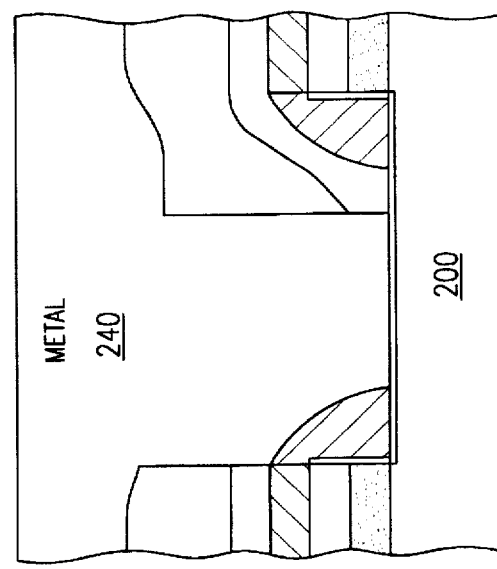

This results in the structure shown in FIGS. 7A and 7B.

Advantages

Advantages resulting from the innovative process and structure include:

Elimination of notching in gate patterning (due to the anti-reflective effect of the $Si_3N_4$ layer), and consequently better process latitude and linewidth control;

Reduction in overetch of field oxide, and hence (optional) Reduction in field oxide thickness, with consequent reduction in topography. For example, in the presently preferred embodiment the field oxide was specified at 5000 Å, as opposed to 6000 Å in a comparable standard traveller.)

Provision of a complete self-aligned contact scheme, wherein

No minimum spacing is required between contact and gate, and hence

Significant reduction in both matrix and periphery layout area is achieved. This implies a smaller die size, and hence an increase in the number of dice per wafer, and a reduction in the cost per die.

The layout process is simplified.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

Of course other structures can be used in place of the specific polycide gate structure described. The invention will work with poly/$TaSi_x$ composites (and in fact this is contemplated as a possibly advantageous alternative), and with a wide variety of other gate structures, including but not limited to poly/$TiSi_x$/TiN, metallized poly, etc.

The anti-reflective layer 214 and the sidewall filaments 220 can alternatively be formed of materials other than silicon nitride. For example, oxynitrides can be used, or other dielectric materials which have lower reflectivity than a silicide and good etch selectivity to oxide film; i.e. oxynitride, metallic oxides, etc.

It should also be noted that the anti-reflective layer 214 and the sidewall spacers 220 do not necessarily have to be composed of identical materials (although both should be materials which have some ability to withstand an oxide etch).

While the inventions have been described with primary reference to a single-poly process, it will be readily recognized that these inventions are equally applicable to double-poly or triple-poly structures and processes. Similarly, while the contact from first metal to first poly and active has been particularly described, it will be readily recognized that the disclosed inventions are equally applicable to processes with multiple layers of metal (and in fact would be most commonly used in such processes). For example, the disclosed innovations can be used to make contact from second poly to first poly and active, or from metal to first poly and second poly and active, or in other ways which will be obvious to those of ordinary skill in the art.

Similarly, it will be readily recognized that the described process steps can also be embedded into hybrid process flows, such as BiCMOS or smart-power processes.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit, comprising:

a body of semiconductor material, having active areas therein separated by field dielectric regions of a first dielectric material;

a first patterned thin-film conductor layer, capacitively coupled to said semiconductor material in multiple transistor channel locations in said active areas, and also running across portions of said field dielectric regions;

an interlevel dielectric material overlying said first thin-film conductor layer, and having contact holes therein;

a second patterned thin-film conductor layer overlying said interlevel dielectric material, and extending down through said contact holes to make contact to said first conductor layer in first selected locations, and also to said active areas in second selected locations;

wherein a layer of a second dielectric material, which is chemically different from said first dielectric material and from said interlevel dielectric material, covers sidewalls of said first conductor layer at said second selected locations, and sidewall spacers of said second dielectric material cover sidewalls of said second dielectric material layer at said first selected locations, and overlies said first conductor layer, beneath and in contact with said interlevel dielectric material, except where said second conductor layer makes contact to said first conductor layer, and does not contact any other part of said active area; and wherein at least a portion of said second conductor layer touches said layer of said second dielectric material in said first and second selected locations.

2. The integrated circuit of claim 1, wherein said first dielectric material is chemically similar to said interlevel dielectric material.

3. The integrated circuit of claim 1, wherein said first dielectric material is silicon dioxide.

4. The integrated circuit of claim 1, wherein said semiconductor material consists of silicon.

5. The integrated circuit of claim 1, wherein said first conductor layer consists of polysilicon clad with a metal silicide.

6. The integrated circuit of claim 1, wherein said first thin-film conductor layer is capacitively coupled to said semiconductor material, in said transistor channel locations, through a dielectric layer which consists of silicon dioxide.

7. The integrated circuit of claim 1, wherein said second dielectric material consists of silicon nitride.

8. The integrated circuit of claim 1, wherein said interlevel dielectric material comprises a doped silicate glass over an undoped silicate glass.

9. The integrated circuit of claim 1, wherein said second conductor layer consists of a metallic composition.

10. The integrated circuit of claim 1, wherein said second conductor layer consists of a polycrystalline semiconductor material.

11. An integrated circuit, comprising:
a body of semiconductor material, having active areas therein separated by field dielectric regions of a first dielectric material;
a first patterned thin-film conductor layer, capacitively coupled to said semiconductor material in multiple transistor channel locations in said active areas, and also running across portions of said field dielectric regions;
an interlevel dielectric material overlying said first thin-film conductor layer, and having contact holes therein;
a second patterned thin-film conductor layer overlying said interlevel dielectric material, and extending down through said contact holes to make contact to said first conductor layer in first selected locations, and also to said active areas in second selected locations;
wherein a layer of a second dielectric material, which is chemically different from said first dielectric material and from said interlevel dielectric material, covers sidewalls of said first conductor layer at said second selected locations, and sidewall spacers of said second dielectric material cover sidewalls of said second dielectric material layer at said first selected locations, and overlies said first conductor layer, beneath and in contact with said interlevel dielectric material, except where said second conductor layer makes contact to said first conductor layer, and does not contact any other part of said active area; and wherein at least a portion of said second conductor layer touches said layer of said second dielectric material in said first and second selected locations.

12. The intergrated circuit of claim 11, wherein said first dielectric material is chemically similar to said interlevel dielectric material.

13. The integrated circuit of claim 11, wherein said first dielectric material is silicon dioxide.

14. The integrated circuit of claim 11, wherein said semiconductor material consists of silicon.

15. The integrated circuit of claim 11, wherein said field dielectric consists of silicon dioxide.

16. The integrated circuit of claim 11, wherein said first conductor layer consists of polysilicon clad with a metal silicide.

17. The integrated circuit of claim 11, wherein said first thin-film conductor layer is capacitively coupled to said semiconductor material, in said transistor channel locations through a thin dielectric layer which consists of silicon dioxide.

18. The integrated circuit of claim 11, wherein said second dielectric material consists of silicon nitride.

19. The integrated circuit of claim 11, wherein said interlevel dielectric material comprises a doped silicate glass over an undoped silicate glass.

20. The integrated circuit of claim 11, wherein said second conductor layer consists of a metallic composition.

21. The integrated circuit of claim 11, wherein said second conductor layer consists of a polycrystalline semiconductor material.

22. An integrated circuit, comprising:
a body of semiconductor material, having active areas therein separated by field dielectric regions of a first dielectric material;
a first patterned thin-film conductor layer, capacitively coupled to said semiconductor material in multiple transistor channel locations in said active areas, and also running across portions of said field dielectric regions;
an interlevel dielectric material, comprising a silicate glass, overlying said first thin-film conductor layer, and having contact holes therein;
a second patterned thin-film conductor layer overlying said interlevel dielectric material, and extending down through said contact holes to make contact to said first conductor layer in first selected locations, and also to said active areas in second selected locations;
wherein a layer of silicon nitride covers sidewalls of said first conductor layer at said second selected locations, and sidewall spacers of said silicon nitride cover sidewalls of said silicon nitride layer at said first selected locations, and overlies said first conductor layer, except where said second conductor nlayer makes contact to said first conductor layer, beneath and in contact with said interlevel dielectric material, and does not contact any other part of said active areas; and wherein at least a portion of said second conductor layer touches said layer of silicon nitride in each of said first and second selected locations.

23. The integrated circuit of claim 22, wherein said first dielectric material is chemically similar to said interlevel dielectric material.

24. The integrated circuit of claim 22, wherein said first dielectric material is silicon dioxide.

25. The integrated circuit of claim 22, wherein said semiconductor material consists of silicon.

26. The integrated circuit of claim 22, wherein said first conductor layer consists of polysilicon clad with a metal silicide.

27. The integrated circuit of claim 22, wherein said first conductor layer comprises polysilicon, and is laterally separated from said silicon nitride by a thin layer of oxide.

28. The integrated circuit of claim 22, wherein said first thin-film conductor layer is capacitively coupled to said semiconductor material, in said transistor channel locations, through a dielectric layer which consists of silicon dioxide.

29. The integrated circuit of claim 22, wherein said interlevel dielectric material comprises a doped silicate glass over an undoped silicate glass.

30. The integrated circuit of claim 22, wherein said second conductor layer consists of a metallic composition.

31. The integrated circuit of claim 22, wherein said second conductor layer consists of a polycrystalline semiconductor material.

32. The integrated circuit of claim 11, wherein a thin layer of oxide laterally separates said sidewall spacers of said second dielectric material from said sidewalls of said first conductor layer.

* * * * *